United States Patent [19]

Keogh et al.

[11] 4,246,335
[45] Jan. 20, 1981

[54] SHAPE DISPENSING OF PHOTOPOLYMER

[75] Inventors: Kevin E. Keogh, Seekonk, Mass.; John J. Zimmer, Monroeville, Pa.

[73] Assignee: W. R. Grace & Co., Cambridge, Mass.

[21] Appl. No.: 28,485

[22] Filed: Apr. 9, 1979

[51] Int. Cl.³ .......................... G03C 1/94; B05C 5/02
[52] U.S. Cl. ................................. 430/278; 118/101; 118/415; 118/694; 427/358; 430/300
[58] Field of Search .................. 118/18, 26, 100, 101, 118/407, 415, 120, 694; 401/1, 2, 48; 427/358, 356; 425/110; 430/300, 270, 278

[56] References Cited

U.S. PATENT DOCUMENTS

| 3,489,102 | 1/1970 | Lunin | 118/411 X |
|---|---|---|---|
| 3,597,080 | 8/1971 | Gush et al. | 355/85 |
| 3,782,327 | 1/1974 | Wessells et al. | 118/100 |
| 3,792,682 | 2/1974 | Phipps | 118/415 X |
| 3,957,015 | 5/1976 | Harris | 118/100 |
| 3,988,070 | 10/1976 | Tobler et al. | 401/2 |
| 4,120,721 | 10/1978 | Ketley et al. | 427/44 X |
| 4,135,651 | 1/1979 | Hession et al. | 118/415 X |
| 4,143,187 | 3/1979 | Pilgrim et al. | 118/415 X |

*Primary Examiner*—John P. McIntosh
*Attorney, Agent, or Firm*—Edward J. Hanson, Jr.; C. Edward Parker

[57] ABSTRACT

A device and method for accurately dispensing liquid photopolymer in accurate predetermined configuration to form a printing plate blank. The device gravity feeds the photopolymer from a first manifold through capillary tubes to a second manifold machined in an elongated member together with a doctor blade portion, laying down a carefully sculptured sheet. The sheet is formed into a printing plate upon exposure to actinic light through an indicia carrying negative. The invention may have other applications.

11 Claims, 3 Drawing Figures

U.S. Patent    Jan. 20, 1981    4,246,335
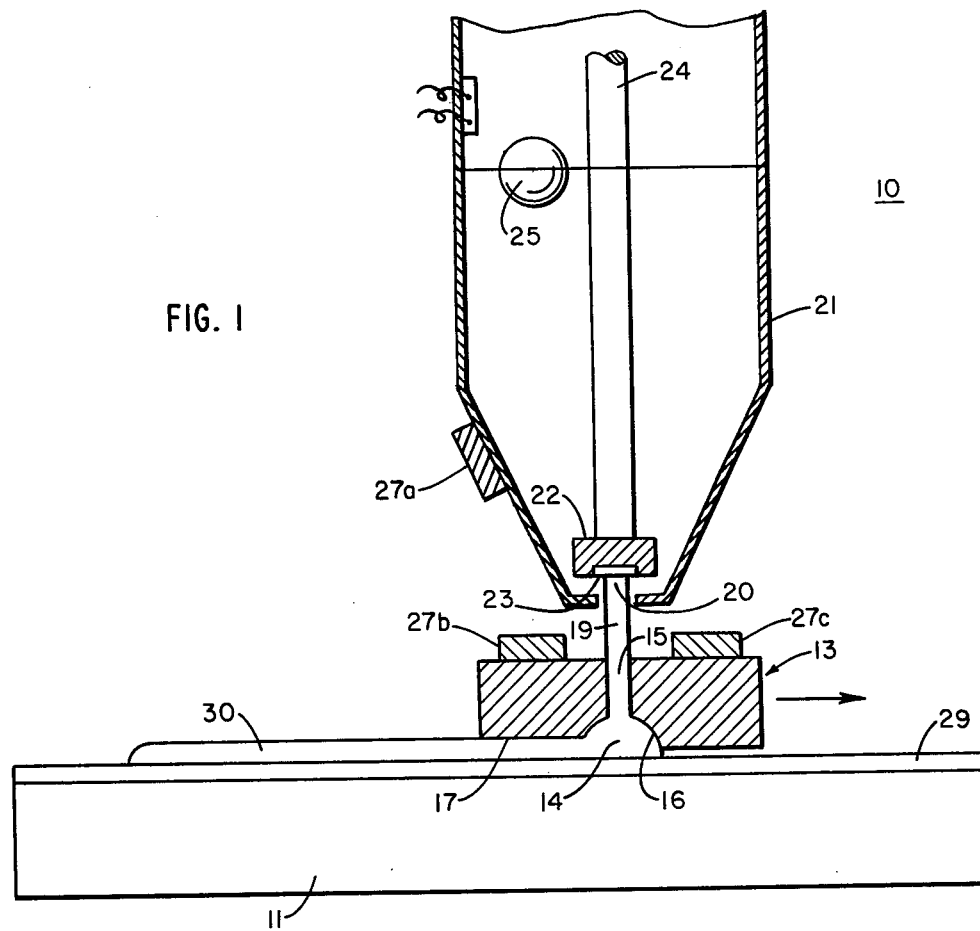
FIG. 1
FIG. 2
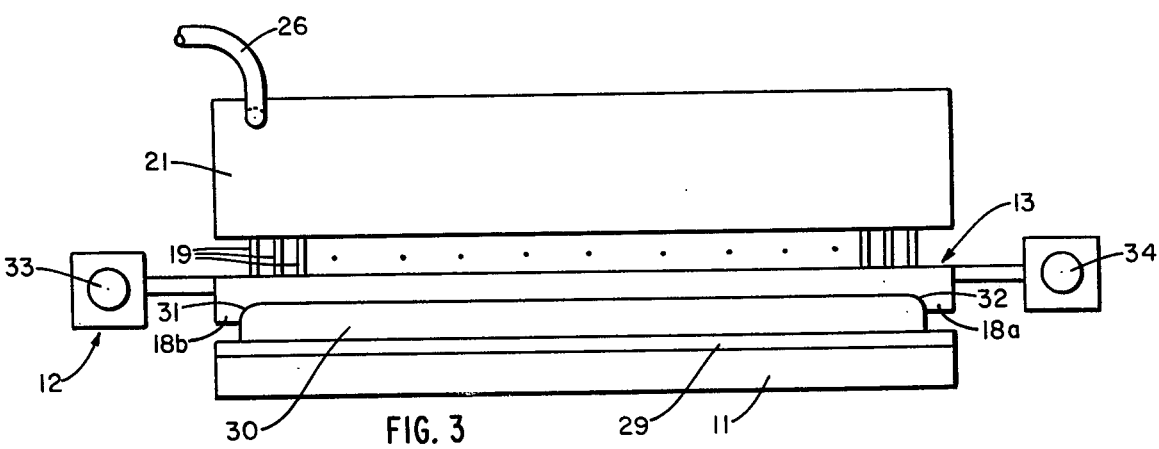
FIG. 3

SHAPE DISPENSING OF PHOTOPOLYMER

BACKGROUND OF THE INVENTION

In the past liquid photopolymer printing plate blanks were formed by dispensing a pool of photopolymer in front of a doctor blade which spread and shaped the polymer as illustrated, for example in U.S. Pat. No. 3,597,080 which depicts in general a current commercial embodiment.

While present photopolymer printing plates are rectangular in shape it has been very difficult in the past to maintain complete reproducibility in configuration in forming the liquid photopolymer printing plate blanks with straight sides. The tendency in the past has been for the sides to draw in or bulge out or extend out a greater distance at the top or bottom of the laydown particularly at the bottom of the laydown on one edge rather than being straight across. In order to assure a sufficiently large area that is of a uniform thickness and within the length and width requirements of the sheet of the viscous liquid plate blank it is necessary to add additional margin, which wastes polymer, even with the recycling of most of the excess. Furthermore it has been necessary to constantly readjust and fine tune the dispensing and shaping apparatus during a day's run to keep reasonable uniformity of size within the required thickness specifications.

It is therefore an object of the present invention to prevent the waste of polymer.

It is a further object of the present invention to increase the quality of the printing plate blank produced and thereby increase the quality of the printing plate produced.

It is a further object of the present invention to save manpower required in adjusting and operating the apparatus.

It is yet a further object of the invention to increase the speed of printing plate output, increasing the number of blanks that can be produced in an hour.

It is a further object of the present invention to produce an apparatus that is less expensive and simpler in construction, maintenance and operation than those previously employed.

SUMMARY OF THE INVENTION

By an aspect of the invention a device is provided producing a liquid photopolymer printing plate blank. The device includes a polymer supply source, a first manifold in receiving communication with the polymer supply source, a second elongated manifold having at least one inlet communicating with a sealable outlet from the first manifold. The second manifold is machined in a single piece of metal with a radius open on one side with one edge of the radius forming a dam and the other side edge of the radius opening out. A platen is opposite the open side of the radius and cooperates with the dam to prevent leakage from the manifold. A doctor blade is integral with the second manifold and machined in the same piece of metal. The doctor blade is also elongated and is aligned with the manifold and has a dam at each end integral with the dam formed by the one edge of the radius of the manifold.

A liquid dispensing and shaping apparatus is provided in which a hollow reservoir body has an open side and at least one inlet, at least a portion of one edge of the open side forming a dam and at least a portion of the opposite edge of the open side opening out, a doctor means is provided in working association with said opposite edge where it opens out. The dam is preferably spaced from a work surface a distance that will not allow any substantive exeuding of a polyurethane acrylate based photopolymer liquid like the ones described in the Examples of U.S. Pat. No. 4,120,721 adjusted to a viscosity of 2000 with a reservoir and dam movement of 1 inch per second in the direction said dam is disposed with regard to said reservoir.

By another aspect of the invention a method of forming a printing plate is provided that includes continuously dispensing and shaping a sheet of liquid photopolymer into a liquid photopolymer printing plate blank by (1) dispensing a confined pool of photopolymer,
(2) moving the confining means away from the pool leaving part of the contents of the pool behind,
(3) maintaining the pool full and continuous with the contents left behind, and
(4) leveling that portion of the contents of the pool being left behind while mechanically shaping the two outer edges thereof.

The liquid photopolymer printing plate blank is exposed to actinic light through an indicia barring material for a time sufficient to solidify the radiation curable composition in the exposed portions. Afterwards unexposed radiation curable composition is removed to form said printing plate which is installed on a printing press and printing is begun.

DESCRIPTION OF THE DRAWINGS

FIG. 1 is a diagrammatic cut-away side plan view of the device of the present invention in simplified form.

FIG. 2 is a isometric view illustrating the bottom surface configuration of the manifold doctor blade dispensing shaping member 13 of FIG. 1.

FIG. 3 is a diagrammatic rear plan view of the apparatus of FIG. 1 looking in the direction of its movement.

DESCRIPTION OF THE PREFERRED EMBODIMENT

Referring to FIGS. 1 and 3 a liquid photopolymer printing plate blank forming device 10 is shown. The device includes a platen 11 and an associated carriage means 12 which moves above the platen's surface. The carriage and the platen are connected together by suitable frame members not shown. The carriage carries an elongated member 13 that contains a manifold 14 (also see FIG. 2) which has a plurality of inlets 15 aligned along its length. The manifold is machined in a single piece of metal with a radius that is open on one side and has inlets 15 entering opposite the open side. One edge 16 of the radius forms a dam and the other side of the radius opens out toward the platen. The platen cooperates with the dam to prevent leakage from the manifold.

The member 13 has an integral doctor blade 17 machined into the same unitary piece of metal as the manifold 14. The doctor blade is elongated and aligned with the manifold 14 and has dams 18a and 18b at each respective end integral with the dam 16 formed by the edge of the radius of the manifold 14. The manifold 14 is fed through inlets 15 via ducts 19 which are connected to outlets 20 of a feed manifold 21. A single bar member 22 having pad means 23 is operable to seal off the feed manifolds outlets 20 when it is desired to stop the supply of polymer. The single bar member 22 is operated through the movement of a seal actuating shaft 24. The movement of the carriage 12 and the actuation of the seal actuating shaft 24 may be interconnected by suitable powered sequencing means in a manner well known to those skilled in the art.

The feed tank 21 is preferably maintained at a constant head in order to provide a steady controlled gravity flow through the manifold 14. In this regard a sensing mechanism illustrated as a float 25 may be interconnected with a larger supply vessel (not shown) which may feed through one or a plurality of flexible hoses 26 to maintain the head at a substantially uniform height in the tank 21. Heaters such as those illustrated by bar heaters 27a, 27b and 27c may be provided for maintaining the viscosity of the photopolymer at a predetermined value.

In the usual case the platen 11 and elongated member 13 will be placed such that an intermediate substrate backing 29 for the printing plate blank is interposed between them. The printing plate blank 30 is then formed on the substrate 29. It may be seen that the doctor blade 17 is curved where it merges with the dams 18a and 18b to form and shape the two upper edges 31 and 32 of the printing plate blank.

In its preferred form the radius of the manifold 14 is preferably between 60 and 1000 mils, more preferably 62 and 250 mils. The ducts 19 preferably have diameters between 30 and 500 mils, more preferably between 90 and 250 mils. The dam 16 is preferably spaced from the adjacent substrate or platen surface by 0 to 100 mils, more preferably 1 to 20 mils. The doctor blade 17 preferably has a doctoring width of 250 to 2000 mils, more preferably 500 to 1500 mils and is preferably spaced 2 to 350 mils and more preferably 2 to 120 mils above the spacing substrate or platen.

The manifold 14 is preferably gravity fed from the first manifold and the manifold 21. The polymer gauge level in manifold 21 preferably maintains the polymer height or head in the feed manifold between 1 and 10 inches more preferably between 3 and 6 inches. The feed manifold 21 is preferably 0.250 to 3.0 inches more preferably 0.250 to 0.500 inches above the dispense manifold 14. The ducts 19 are preferably spaced between 125 and 1000 mils more preferably 250 to 500 mils on center where they enter the second manifold.

The carriage means 12 is preferably mounted and guided above the platen by mounting on opposite sides by guide rods 33 and 34 and powered substantially as shown for the carriage of U.S. Pat. No. 3,597,080, the contents of which are incorporated herein by reference. The carriage's rate of movement is 0.5 to 12.0 more preferably 1.0 to 3.0 inches per second.

Turning now to the method of the present invention, a procedure is provided for forming a printing plate by continuously dispensing and shaping a feed of liquid photopolymer. The liquid photopolymer is dispensed and confined in a pool in the manifold 14. The confining means 14 moves away from the pool leaving part of its contents behind. The pool is maintained full and continuous with the contents left behind. That portion of the contents of the pool left behind is leveled and mechanically shaped along its two upper edges to a rounded configuration.

In the preferred method the pool of liquid photopolymer is maintained full by means of gravity feeding through capillary ducts and the confining means is spaced from the surface on which the liquid photopolymer is being dispensed by an amount previously specified and the liquid photopolymer's viscosity is preferably maintained between 500 and 20,000 cps more preferably between 1800 and 6000 cps. The cps' given in the present application will be understood to be determined in a Brookfiled Viscometer with a No. 4 spindle at 60 RPM's at operating temperature.

Preferably on shutdown the liquid photopolymer in the capillary ducts remains in the ducts due to surface tension and the pool is not maintained but is left behind, leveled and shaped. The term capillary duct as used in this application means only a property by which substantially all of the liquid in the duct remains in the duct when the top of the duct is sealed.

In an operation using the device and method of the present invention to form a printing plate a carriage 12 mounts an elongated member 13 for movement above a platen 11 with a spacing of 15 mils. The actual length of the elongated member was 38 inches long because it was a dual unit containing two side by side liquid dispensing and shaping stations each of which had a 15½ inch doctor blade length. However for simplicity the description will proceed with the drawing showing the single station unit.

Bar heaters 27b and 27c were changed to a single 100 watt ¼ inch cartridge heater sunk into the surface of the member 13 just above the doctor blade portion 17. The heater on the feeding manifold 21 was a 500 watt resistance bar. The width of the doctor blade from the edge of the manifold 14 to its outer edge was 1 inch, the radius of the manifold was 125 mils and the distance from the dam 16 to the outer edges of the member 13 was also 1 inch. The inlets 15 had hole diameters of 91 mils with the inlets being spaced 500 mils apart on center.

The carriage was positioned to start its movement across the substrate sheet. Preheated polymer was fed into the feed manifold 21 through inlets 26 until a head of 4 inches was achieved at which time a capacitive proximity switch in place of the float 25 signaled a cut-off. The sealing mechanism of the single bar member 22 was closed at the intiial filling of the feed manifold 21. An aluminum substrate sheet 10 mils thick was placed on the platen. The member 13 was thus spaced 5 mils above the substrate sheet. The sealing mechanism was then opened, opening outlets 20 by opening the sealing pad means 23. The polymer flowed through the ducts 19 into the inlets and to the manifold 14. When the polymer appeared at the outer edge of doctor blade 17 the carriages movement was begun and the pool of polymer in the manifold 14 was spread by the doctor blade 17 onto the substrate 29 in an even and uniform liquid printing plate blank formation having rounded edges 31 and 32. The polymer viscosity was approximately 2000 cps. The tank temperature was maintained at about 115° F. as was the member 13. The polymer was charged into the feed manifold 21 preheated to a temperature of approximately 115° F.

The carriage was moved at a rate of about 1 inch per second. The blank laid down was approximately 15½ inches wide by 24 inches long. Approximately 1 second before the carriage reached the end of its laydown movement an automatic signal shut off the outlets 20 from the feed manifold 21. The polymer in the pool 14 was doctored, leveled and shaped and the polymer in the ducts 19 and inlets 15 remained in position. The carriage then reciprocated to its starting position and the level member 25 signaled for the addition of the required polymer to replenish the head manifold which would require approximately 150 ml. of polymer for each station. The quantity of polymer in the feed manifold 21 is approximately 1.5 gallons per station. A new sheet of substrate was placed in position and the machine automatically cycled again. The machine operated at a rate of 120 blanks per hour and at the end of a run of 1 hour the machine was shut off by stopping its cycling at the beginning position for the laying down of a photopolymer printing plate blank.

It was not necessary to purge the machine on shut down. The polymer was allowed to remain in the feed manifold 21 and in the ducts 19 and the inlets 15. Because it is not exposed to any significant amount of actinic light it remains at a viscosity of about 2000 cps with the heaters remaining on. Operation was commence the next day without any special start up procedure or refilling of the feed manifold.

After each of the photopolymer printing plate blanks had been formed on the substrate 29 and substrate with the photopolymer printing plate blank was moved to the next station where is was exposed to actinic light through an indicia carrying negative after which the uncured polymer was removed by an air knife dry etcher and recycled to the supply tank (not shown) feeding through the inlet 26. The virgin polymer used in this run was LETTERFLEX ® Y ™ photopolymer available from W. R. Grace & Co. which as a virgin viscosity of approximately 2500 cps and a recycle viscosity of approximately 7000 cps at normal room temperature. The heated viscosity of the virgin polymer was approximately 2000 cps and the heated viscosity of the recycled polymer was approximately 2500 cps. The printing plate was found to have excellent uniformity and to produce minimum recycle material because of the accurate laydown of the photopolymer printing plate blank. It was also found that the dam can be clear of the substrate by a distance of several mils so that there is no scouring or scraping of the substrate and when the apparatus is in operation no substantive polymer extrudation occurs from the side dam areas 18a and 18b. Thus no seals need be used which seals would likely have wear problems.

It was found during operation that after initial adjustment for speed and setup the device operated continuously without maintenance or adjustment. It was noted that each successive printing plate was of the same dimensions as the preceeding printing plate. The shape of the printing plates was also identical with parallel sides and square corners. Plates were compared using the first two plates made and the last two plates made and were found to be identical in size and shape. For the first time, it was possible to restart the platemaking machine after some period of downtime (overnight) and make printing plates of the same size and shape without any adjustments. It was also noted that the speed of the platemaking process could be increased by 33% with this device. Finally, clean-up maintenance of this device is reduced significantly over the previous method.

While the present invention has been described with regard to a single sheet laydown unit of the photopolymer for the sake of clarity, in a more preferred from it will be a twin laydown unit with the carriage carrying both units in side-by-side relationship. Furthermore, while the present device has been described with regard to the carriage moving it will be obvious to those skilled in the art that it will be possible in some instances to move the platen instead of the dispensing shaping device member 13. Furthermore, while the present invention has been described with regard to the formation of printing plates it may also be useful for other applications to dispense photopolymers—for example in the formation of photopolymer floor coverings or electronic photoresist and even in the dispensing and shaping of other viscous liquids.

It will be obvious to those skilled in the art that various changes and modifications may be made in the invention without departing from its true spirit and scope. It is, therefore, aimed in the appended claims to cover all such equivalent variations, as fall within the true spirit and scope of the invention.

It is claimed:

1. A liquid dispensing and shaping apparatus for providing sequential dispensing of discrete substantially rectangular pools of liquid comprising
   (1) an elongated linearly aligned manifold, open on one side and having a plurality of aligned inlets on the opposite side, one linear edge and at least a portion of the two ends of said open side forming a dam with the opposite edge opening out at a height below the upper most extremity of the manifold,
   (2) a doctor blade in working association with said opposite edge of the manifold where it opens out,
   (3) a plurality of capillary ducts feeding respective inlets in said manifold and remaining continuously open to said inlets and continuously full of polymer during sequential operation of said liquid dispensing and shaping apparatus,
   (4) a plurality of feed outlets feeding respective capillary ducts,
   (5) valving means mechanically interconnected for unitary opening and closing of said plurality of feed outlets,
   (6) a gravity feeding liquid supply reservoir feeding said plurality of outlets, and
   (7) a reservoir liquid level sensing and control means maintaining said liquid level in said reservoir at a predetermined head, said head providing the sole means of liquid pressure at said inlets to said manifold.

2. The liquid dispensing and shaping apparatus of claim 1 wherein said doctor blade and said manifold are machined into the same piece of unsegmented metal and said doctor blade is contiguous with and extends the length of the manifold and said valving means is a single bar member with pad means engageable with said outlets respectively.

3. The liquid dispensing and shaping apparatus of claim 2 wherein said liquid supply reservoir is heated and said manifold is heated and has the form of a radius between about 60 and about 1000 mils, said capillary ducts are between about 30 and about 250 mils in diameter, and said doctor blade has a doctoring width of about 250 to about 2000 mils.

4. The liquid dispensing and shaping apparatus of claim 3 comprising a carriage mounting said manifold and doctor blade, capillary ducts, feed outlets, valving means and supply reservoir and moving above a platen and guided on opposed sides by guide rods at a rate of about 0.5 to about 12 inches per second.

5. The liquid dispensing and shaping apparatus of claim 4 wherein said radius is between about 62 and about 250 mils, said ducts are between about 91 and about 250 mils in diameter, said dam formed by one edge of the radius of said manifold is spaced from said platen or substrate by between about 1 and about 20 mils, and said doctor blade has a doctoring width of about 500 and about 1500 mils.

6. The liquid dispensing and shaping apparatus of claim 5 wherein said reservoir liquid level sensing and control means maintain said liquid height in said reservoir between about 1 and about 10 inches and said outlet is between about 0.25 and about 0.5 inches above said manifold and said inlets into said manifold are spaced between about 125 and about 1000 mils on center.

7. A method of sequentially dispensing and shaping a liquid to form a sequence of substantially rectangular sheets comprising
   (1) filling a supply reservoir to a predetermined depth and maintaining said depth,
   (2) intermittently opening and closing a valving means and providing a gravity outflow of liquid from the reservoir,
   (3) feeding the liquid from the reservoir intermittently through a plurality of respective capillary ducts and retaining said capillary ducts substantially full at all times during said sequential operation,
   (4) feeding the liquid from said capillary ducts into an open sided hollow manifold along a linearly aligned path and intermittently breaking the flow into said manifold from every one of said inlets,
   (5) restraining the flow of the liquid from the manifold by a dam formed by an edge of the open side of the manifold,
   (6) flowing the liquid from an opening out portion of the opposite edge of the open side of the manifold when said manifold is fed through the capillary ducts until its contents are exhausted intermittently and restricting the height of the outflow to below the height of the inside of the manifold, and
   (7) leveling the liquid flowing from the opening out portion of said manifold by a doctor means and thereby providing a substantially rectangular sheet of liquid.

8. The method of claim 7 comprising heating the liquid in the supply reservoir and heating the manifold.

9. The method of claim 7 wherein said liquid is flowed from the opening out portion of the manifold by moving the manifold in the direction of the dam and said leveling of the liquid is by moving the doctor means over the surface of the liquid as it flows from the opening out portion of the manifold.

10. The method of claim 9 wherein said manifold is moved at a rate of about 0.5 to about 12 inches per second and the surface of the liquid in the reservoir is maintained between about 1 to about 10 inches above the manifold.

11. The method of claim 10 wherein the surface of the liquid in the reservoir is maintained between about 3 to about 6 inches above the manifold.

* * * * *